United States Patent
Creigh

(10) Patent No.: US 7,350,121 B2
(45) Date of Patent: Mar. 25, 2008

(54) PROGRAMMABLE EMBEDDED LOGIC ANALYZER IN AN INTEGRATED CIRCUIT

(75) Inventor: John Lock Creigh, Rancho Santa Margari, CA (US)

(73) Assignee: Broadcom Corporation, Irvine, CA (US)

( * ) Notice: Subject to any disclaimer, the term of this patent is extended or adjusted under 35 U.S.C. 154(b) by 317 days.

(21) Appl. No.: 11/203,288

(22) Filed: Aug. 15, 2005

(65) Prior Publication Data

US 2006/0036919 A1    Feb. 16, 2006

Related U.S. Application Data

(60) Provisional application No. 60/601,181, filed on Aug. 13, 2004.

(51) Int. Cl.
*G01R 31/28* (2006.01)
(52) U.S. Cl. ....................................................... 714/724
(58) Field of Classification Search ................. 714/724
See application file for complete search history.

(56) References Cited

U.S. PATENT DOCUMENTS

| 6,564,347 B1 * | 5/2003 | Mates ........................ 714/727 |
| 6,704,889 B2 * | 3/2004 | Veenstra et al. .............. 714/39 |
| 7,089,473 B2 * | 8/2006 | Mates ........................ 714/733 |

* cited by examiner

*Primary Examiner*—James C. Kerveros
(74) *Attorney, Agent, or Firm*—Sterne, Kessler, Goldstein & Fox PLLC

(57) ABSTRACT

A logic analyzer having internal access to the test buses, clocks and events of a chip is used to debug the chip. The logic analyzer is designed with the capability to share existing memory in the chip during the debug process. Additionally, the configuration of the logic analyzer and observation of the acquired results in the shared memory can be accessed through normal control interfaces of the chip and does not require special test cards. The logic analyzer includes a clocking function, a trigger function, a signal multiplexer, and a memory block. The clocking function is configured to select as the sample clock for the function any of the clocks in the integrated circuit. In addition, the clocking function may provide a means to decimate these clocks by some factor to sample over larger intervals.

21 Claims, 6 Drawing Sheets

PROGRAMMABLE EMBEDDED LOGIC ANALYZER IN AN INTEGRATED CIRCUIT

CROSS REFERENCE TO RELATED APPLICATIONS

This application claims the benefit of U.S. Provisional Application No. 60/601,181 filed Aug. 13, 2004, which is incorporated herein by reference.

BACKGROUND OF THE INVENTION

Complex integrated circuits are often difficult to debug, particularly in customer environments. Problems that occur in customer environments often occur in specific configurations, environmental conditions, and instances of product. Moreover, the customer is usually using the integrated circuit in an application optimized for production which does not contain all the usual testability interfaces that are available when the chip is production tested. Therefore, the process of understanding the exact set-up and environment required to replicate in the chip designer's laboratory the same bug that the customer experienced can be an extremely time and resource intensive task. In addition, the customer is typically interested in identifying the root cause of the problem and a solution as quickly as possible to avoid delays in shipment of their product to their customers.

BRIEF DESCRIPTION OF THE DRAWINGS/FIGURES

The present invention is described with reference to the accompanying drawings. In the drawings, like reference numbers indicate identical or functionally similar elements. Additionally, the leftmost digit(s) of a reference number identifies the drawing in which the reference number first appears.

FIG. 1 illustrates an integrated circuit with an embedded logic analyzer according to an embodiment of the present invention;

FIG. 2A-B illustrate the operational diagram of the logic analyzer according to an embodiment of the present invention;

DETAILED DESCRIPTION OF THE INVENTION

Identifying and understanding a bug in a complex chip generally requires visibility of the state and sequence of internal nodes inside the chip. These nodes are brought external to the chip via test buses. Typically, a logic analyzer is connected to these external test buses. The logic analyzer then attempts to capture the states and sequences pertinent to the creation of the bug. A special test board is then used to easily access the test bus outputs and to put the chip into a test mode.

By designing a logic analyzer function into the chip with internal access to the test buses, clocks and events of the chip, a significant improvement over previous methods of debugging problems can be achieved. The overhead in chip size needed for this function can be very small, especially if existing RAM in the design can be shared with the logic analyzer during the debug process.

Configuration of the logic analyzer and observation of the acquired results in memory is accessed through normal control interfaces of the chip and does not require special test cards. Thus, when a bug is discovered at the customer site, debugging can occur on the specific customer device and under the specific conditions of the customer's environment. This saves a large amount of time and resources and ensures that the behavior being evaluated is indeed the behavior that is causing the customer problem.

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

An embodiment of the present invention is now described. While specific methods and configurations are discussed, it should be understood that this is done for illustration purposes only. A person skilled in the art will recognize that other configurations and procedures may be used without departing from the spirit and scope of the invention.

Figure 1:
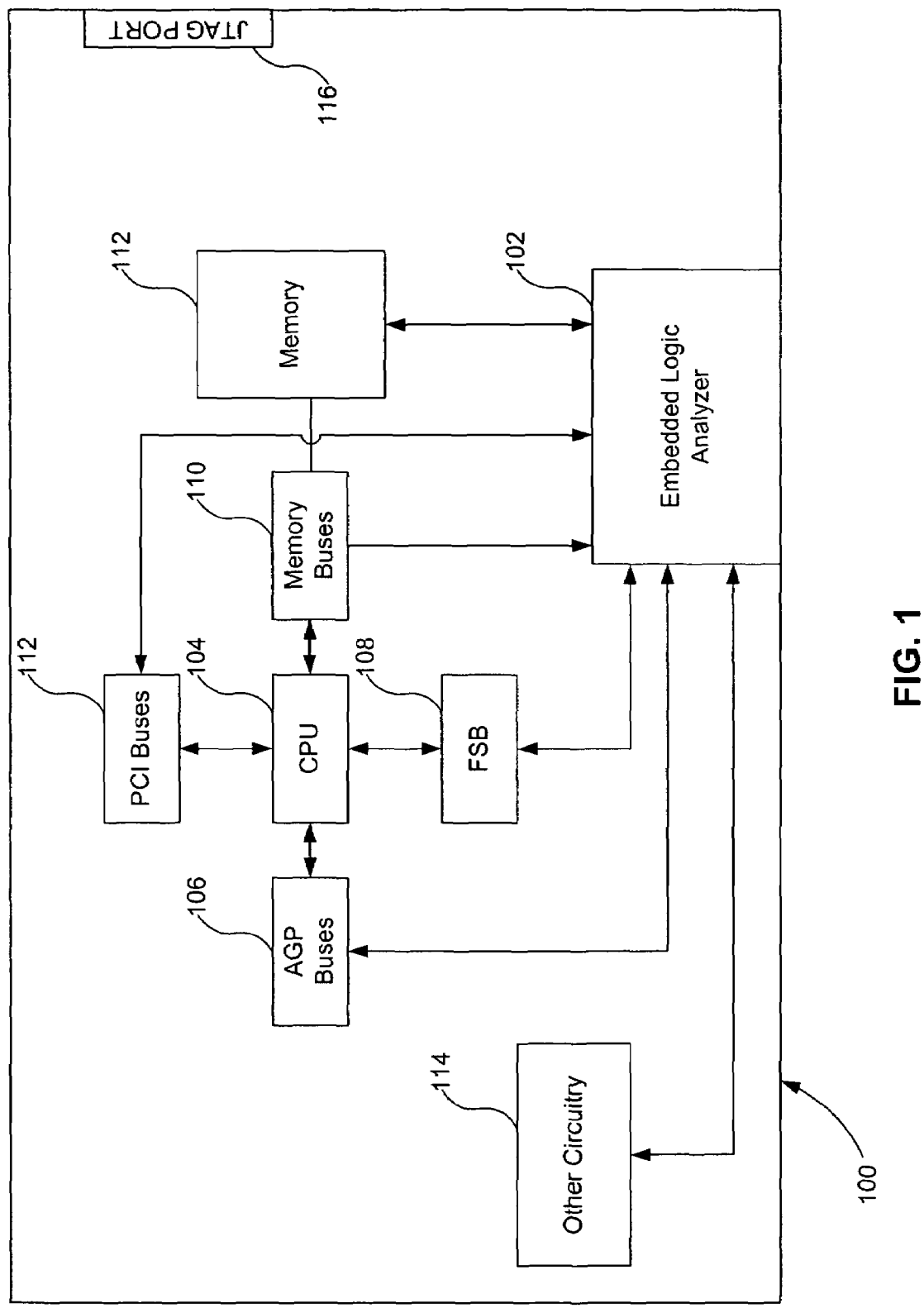

FIG. 1 illustrates an integrated circuit 100 with a programmable embedded logic analyzer according to the present invention. In an embodiment, the integrated circuit 100 comprises a programmable embedded logic analyzer (PELA) 102, a communication port 116, a microprocessor 104, a plurality of communication busses, and other circuitry 114 of the integrated circuit. The microprocessor 104 may have one or more types of communication buses coupled to it such as, but not limited to, a front-side bus 108, an accelerated graphics port 106, a memory bus 110, and a peripheral component interconnect bus 112.

In the integrated circuit 100, the PELA 102 is coupled to each of the communication busses. This allows the PELA 102 to monitor and capture the data directly from those communication buses. PELA 102 is also coupled to other areas of interest (other circuitry) 114 within the integrated circuit. In an embodiment, the integrated circuit 100 is a transceiver integrated circuit.

Additionally, the PELA 102 is coupled to a communication port 116 which can be a serial port or a joint test action group (JTAG) port. The communication port 116 allows a user to program the PELA 102 to monitor and capture data signals from suspected trouble areas of the integrated circuit 100. Additionally, the user could set and define various trigger conditions that will direct the PELA 102 to start the monitoring and data capturing process. For example, a user may program the PELA 102 and direct it to monitor and capture data signals from a bus in memory bus 110 based on the data signals received from a bus in AGP bus 106.

Figure 2A:
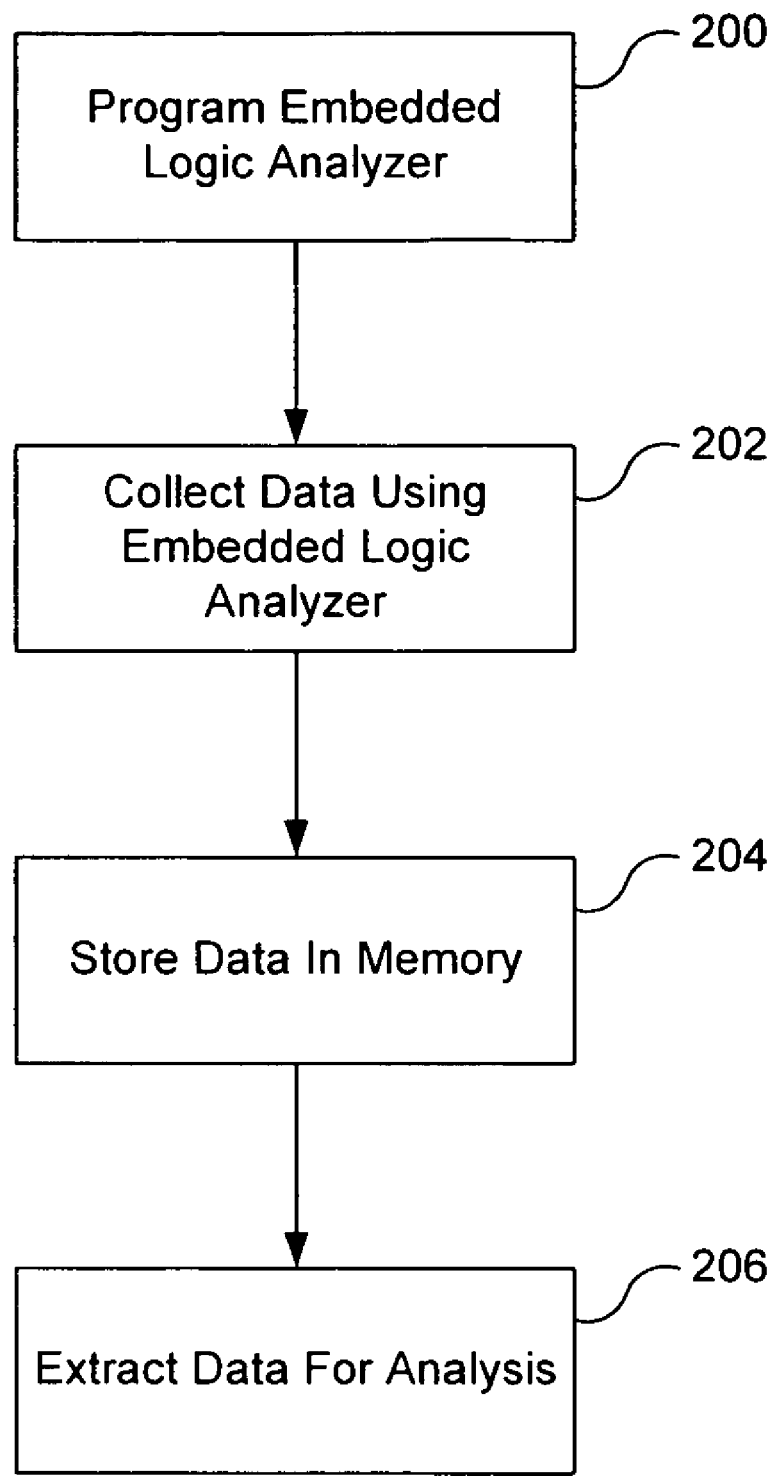

FIG. 2A illustrates a high level operational flow chart of the present invention. In block 200, the PELA is programmed. This programming step comprises the steps of: defining nodes for trigger event monitoring; defining nodes for data capturing, and defining trigger event conditions. In block 202, the PELA 102 collects data in accordance to the programming definitions generated in block 200. In block 204, the PELA 102 stores the collected data in a memory. This memory may be an integrated part of the PELA 102 or a separate component (e.g. a shared memory). In block 206, the stored data is then extracted for data analysis.

Figure 2B:
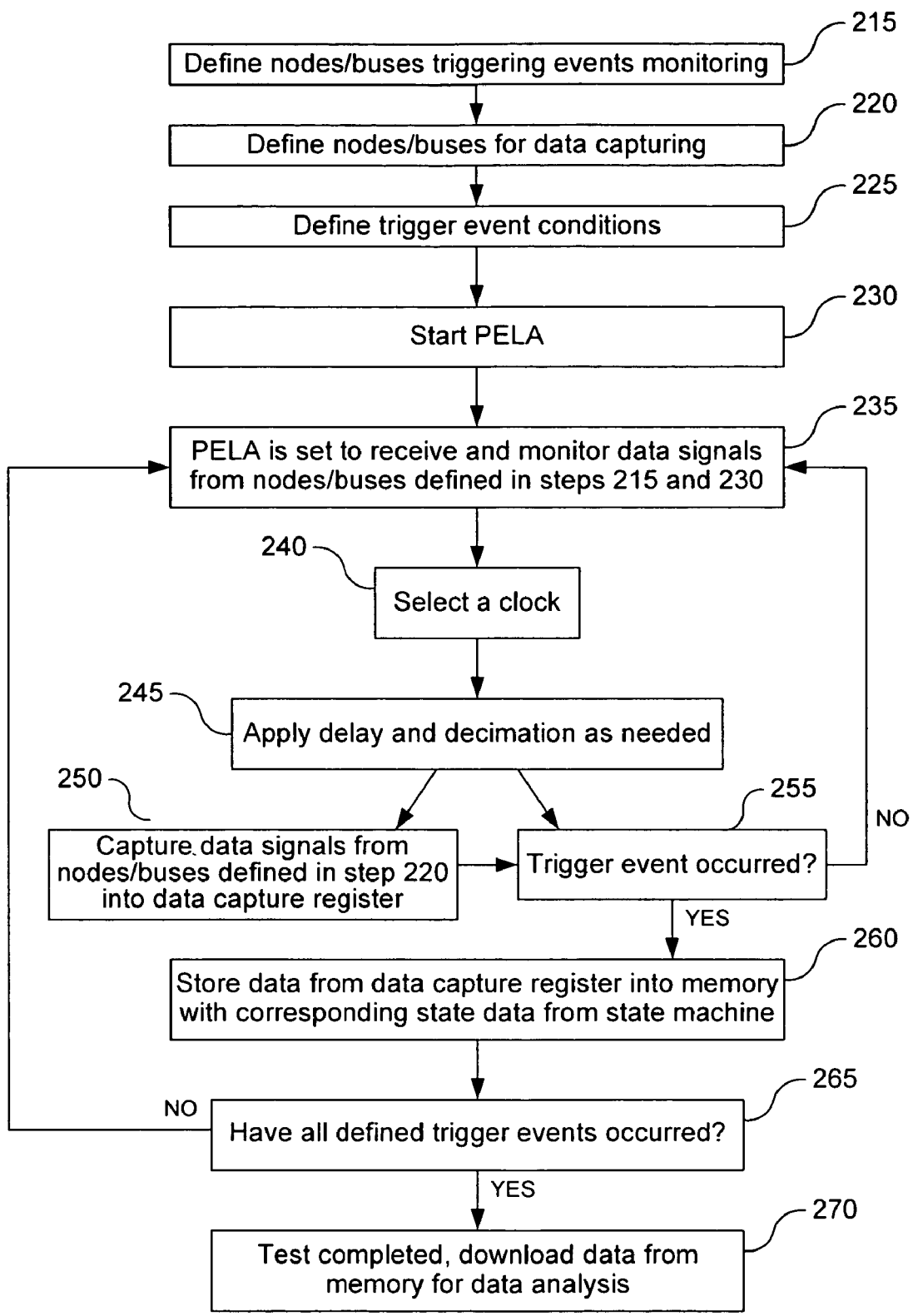

FIG. 2B illustrates an exemplary operation flow chart of the present invention that further defines FIG. 2A. Once a problem has occurred in the customer environment, the PELA 102 can be programmed via the communication port 116 for proper diagnosis. For example, an external device with a graphical user interface and the necessary software for programming the PELA 102 can be coupled to the communication port 116.

In block 215, a user may define nodal points of interests in the integrated circuit (nodes) and/or communication buses for monitoring trigger events. Similarly, in block 220, the user may define which nodes and/or communication buses the PELA 102 should capture the data signals from. It should be noted that the nodes and/or communication buses selected in blocks 215 and 220 may be the same group of nodes and/or communication buses. In an alternative embodiment, the group of nodes and/or communication buses selected in blocks 215 and 220 are different.

In block 225, the user may specify the conditions for the PELA 102 to determine whether a trigger event has taken place. For example, the user may designated a predetermined data signal pattern as a trigger event. This predetermined data signal pattern can be an error data signals pattern. Once the steps in blocks 215, 220, and 225 are completed, the program's definition generated by those steps can be downloaded into the PELA 102. While blocks 215, 220, and 225 are described in sequence, it is noted that blocks 220 and 225 may be performed prior to block 215 or in any other sequence.

In block 230, the PELA 102 is started. In block 235, the PELA 102 automatically sets itself to receive and monitor data signals from nodes and/or buses defined in blocks 215 and 220. In block 240, the PELA 102 selects a clock from one of the clock sources of the integrated circuit for use as a sampling-clock using a clock selector. In an embodiment, clock selector 312 selects a clock from a microprocessor 120, in which microprocessor 120 is the target to be tested. In this way, the PELA 102 can synchronously monitor and capture data from the target. In an alternative embodiment, the PELA 102 selects a clock from a clock generator that is asynchronous to the target to be tested. This gives the PELA 102 the capability to asynchronously monitor and capture the data signals from the target's nodes and/or buses.

In block 245, the PELA 102 applies delay to the sampling-clock based on the type of data signals that it is programmed to monitor. In an embodiment, the PELA 102 decimates the sampling-clock using a decimation circuit. In yet another embodiment, the PELA 102 decimates and delays the sampling-clock based on the type of data signals it is monitoring.

In block 250, the PELA 102 stores the data signals from the selected nodes and/or buses defined in block 220 into a data capture register 324. In an embodiment, the data capture register captures data in response to the sampling-clock signal.

In block 255, the PELA 102 monitors the selected nodes and/or buses defined in block 225 for triggering events using a trigger control logic circuit. In real time operation, the PELA 102 continuously monitors the selected nodes for triggering-event data signals. Once a trigger event has been identified by the trigger control logic circuit, the PELA 102 stores the data from the data capture register into a memory along with corresponding state data from the state machine as described in block 260.

In block 265, PELA 102 ensures that all of the defined trigger events have been identified and that all of the data signals corresponding to those trigger events have been captured. If this condition is not met, the PELA 102 repeats blocks 235-260 until all of the trigger events have been identified and all the data signals for those events have been captured. As described by block 270, once the PELA 102 finishes collecting the data, the data can be downloaded from the memory for later data analysis. In an embodiment, the data can be downloaded from the memory via the communication port 116.

Figure 3:
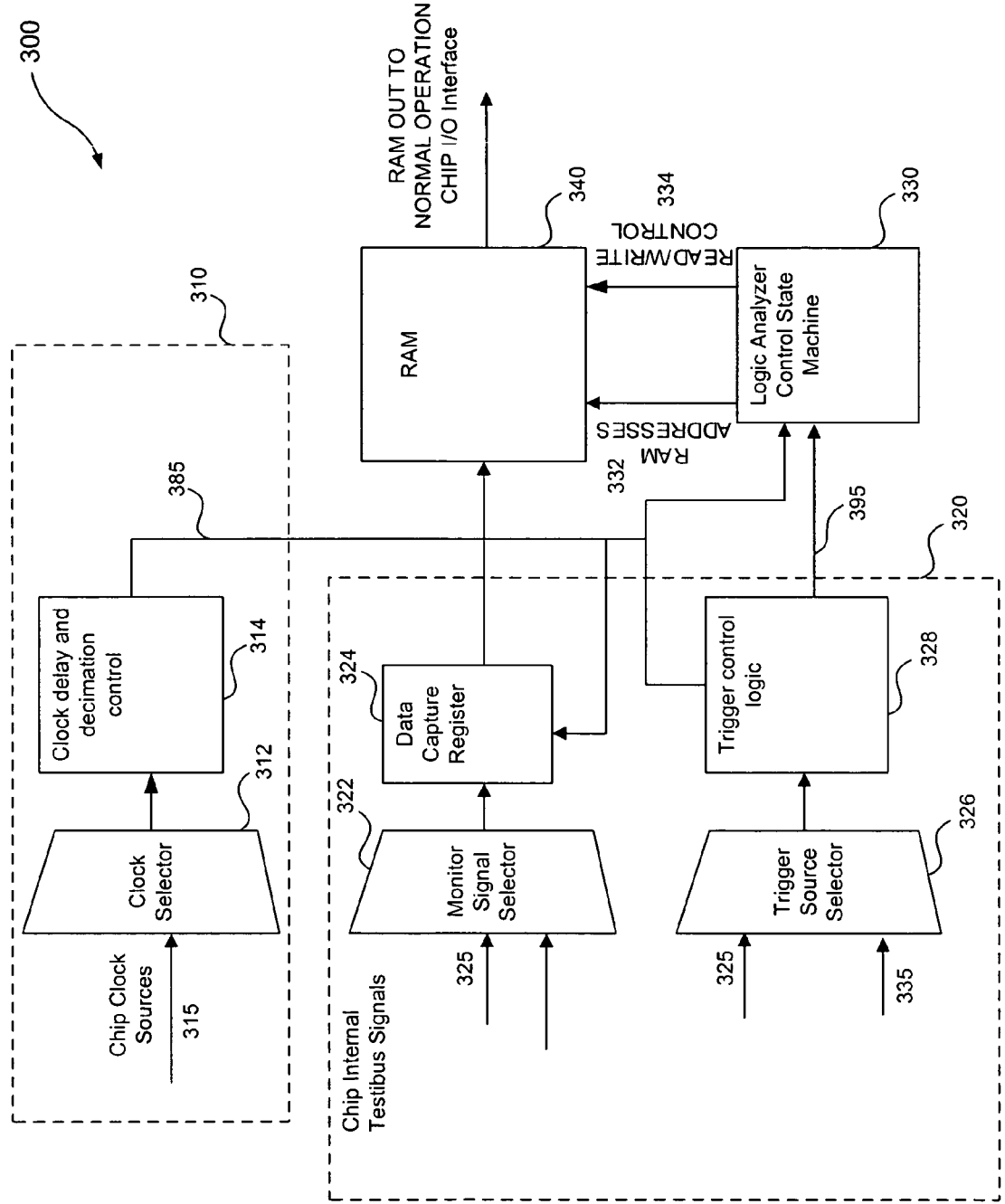
FIG. 3 illustrates an example embodiment of a logic analyzer according to an embodiment of the present invention.

FIG. 3 illustrate an exemplary PELA 102 according to an embodiment of the present invention. The PELA 102 includes a clocking portion 310, a trigger and monitoring portion 320, a logic analyzer control state machine 330, and a memory 340.

The clocking portion 310 includes a sample clock selector 312 coupled in series to a clock delay and decimation controller 314. The clocking portion 310 receives clock sources 315 from the integrated circuit and is configured to generate a sampling-clock signal 385. In an embodiment, clock selector 312 selects a sample clock from a plurality of internal clocks of a microprocessor. The selected sample clock is then delayed and/or decimated by a clock delay and decimation controller 314 to produce a sample clock signal 385 according to the type of data signals that is being monitored by the PELA 102.

The sampling clock signal 385 is then used as an input to trigger and monitoring section 320, and logic analyzer control state machine 330. Trigger and monitoring section 320 includes a monitor signal selector 322, a data capture register 324, a trigger source selector 326, and a trigger control logic circuit 328. The monitor signal selector 322 receives internal test bus signals 325 and other internal monitoring node signals 335. In an embodiment, the signal selector 322 selects its input based on the definitions entered by a user in block 220. The monitor signal selector 322 is coupled in series to the data capture register 324. Monitor signal selector 322 provides input to the data capture register block 324 which captures data in response to the sampling-clock signal 385. The data capture register block 324 is coupled to the memory 340, which writes data into the memory 340 in response to the logic analyzer state control machine 330.

Trigger and monitoring portion 320 also includes a trigger source selector 326 coupled in series with the trigger control logic circuit 328. The trigger source selector 326 receives internal test bus signals 325 and other internal or external trigger sources 345. In an embodiment, trigger source selector 322 selects its input based on the definitions entered by a user in block 325. Trigger source selector 326 also provides input to the trigger control logic circuit 328. The trigger control logic circuit 328 is coupled to the logic analyzer control state machine 330. The trigger control logic circuit 328 provides one or more triggers as input to the logic analyzer control state machine 330.

Logic analyzer control state machine 330 is coupled to the trigger control logic circuit 328 and the memory 340. Logic analyzer control state machine 330 receives one or more triggers from the trigger and monitoring portion 320 and the logic analyzer sampling-clock 385 from the clocking portion 310. Logic analyzer control state machine 330 is configured to provide memory addresses 332 and Read/Write control 334.

In an embodiment, state machine 330 includes a plurality of acquisition states. For example, acquisition states include an initialization state, delay trigger state, triggered state, and acquisition complete state. State machine 330 further includes logic defining conditions for transitioning between acquisition states. State machine 330 causes data from the data capture register 324 to be written into the memory 340 along with corresponding state data.

In an embodiment, memory 340 is a random access memory (RAM). As would be appreciated by persons of skill in the art, other forms of memory can be used with the invention such as, but not limited to, programmable read-only memory (PROM), erasable programmable read-only memory (EPROM), dynamic random access memory (DRAM), and static random access memory (SRAM).

In an embodiment, memory 340 is a dedicated memory for the PELA 102 where data signals, state data, and test program's definitions from block 200 are stored. In an alternative embodiment, memory 340 is shared with other functions of the integrated circuit.

Figure 4:
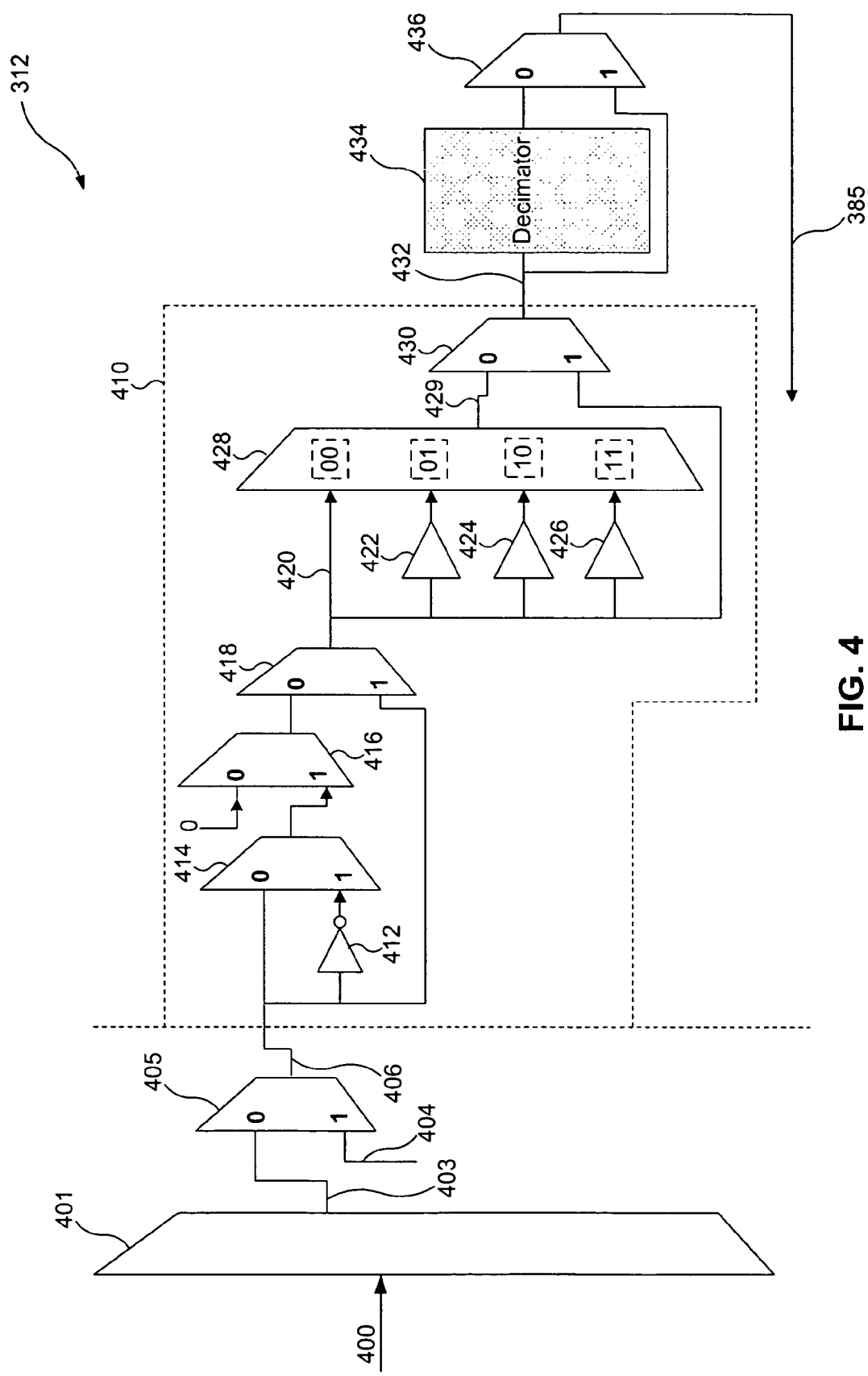
FIG. 4 illustrates an implementation example of a clock control circuit.

FIG. 4 depicts an exemplary clocking portion 312 according to an embodiment of the present invention. The clocking portion 312 includes a first clock selector 401, a second clock selector 405, a delay circuit 410, and a decimator 434. The first clock selector 401 selects a sample clock from any of the clock signals 400 in the integrated circuit. The second clock selector 405 selects from the clock signal 403 or the logic analyzer scan clock 404. In an embodiment, the logic analyzer scan clock signal 404 is generated by an internal clock generator (not shown) of the PELA 102. While the PELA 102 is on synchronous data capture mode, clock signal 406 is passed from the second clock selector 405 to the delay circuit 410. Delay circuit 410 delays the clock signal 406 and outputs a delayed clock signal 432.

If PELA 102 is not on synchronous data capture mode, the second clock selector 405 passes the logic analyzer scan clock signal 404 to the delay circuit 410. Delay circuit 410 then passes the scan clock signal 404 directly to the decimator 434 without applying any delay.

The delay circuit 410 includes a signal inverter 412, a signal inversion selector 414, three signal selectors 416, 418, and 430, delay elements 422, 424, and 426, and a delay signal selector 428. The signal inversion selector 414 is configured to receive the clock signal 406 and the output signal of inverter 412. Depending on the type of test to be performed, signal inversion selector 414 may pass any one of the two inputs. If the logic analyzer is enabled, signal selector 416 passes the output of selector 414 to selector 418. Selector 414 is configured to receive clock signal 406 and the output of the selector 416. Depending on the logic analyzer test mode, selector 418 selects any of the two signal inputs and outputs the signal 420.

The signal 420 is configured as input to delay elements 422, 424, and 426, and also to the delay selector 428. Delay elements 422-426 delay their respective input by a certain time amount and output the delayed signal to the delay selector 428. The Delay selector 428 is configured to select a non-delayed signal 420 or any of the delayed signals outputted by delay elements 422-426. Depending on the logic analyzer test mode, the signal selector 430 selects either the non-delayed signal 420 or delayed signal 429, which is the output of delay selector 428, and outputs signal 432.

In an embodiment, clock signal 432 is decimated by the decimator 434 for sampling over larger intervals. Decimator 434 decimates the clock signal 432 by n, where n is an integer greater than 1. Decimator 434 is coupled in series to a third clock selector 436.

In synchronous test mode, the third clock selector 436 selects the output of decimator 434. Otherwise, the third clock selector 436 passes the logic analyzer scan clock signal 404. The output of clock selector 436 is sampling-clock signal 385.

Figure 5:
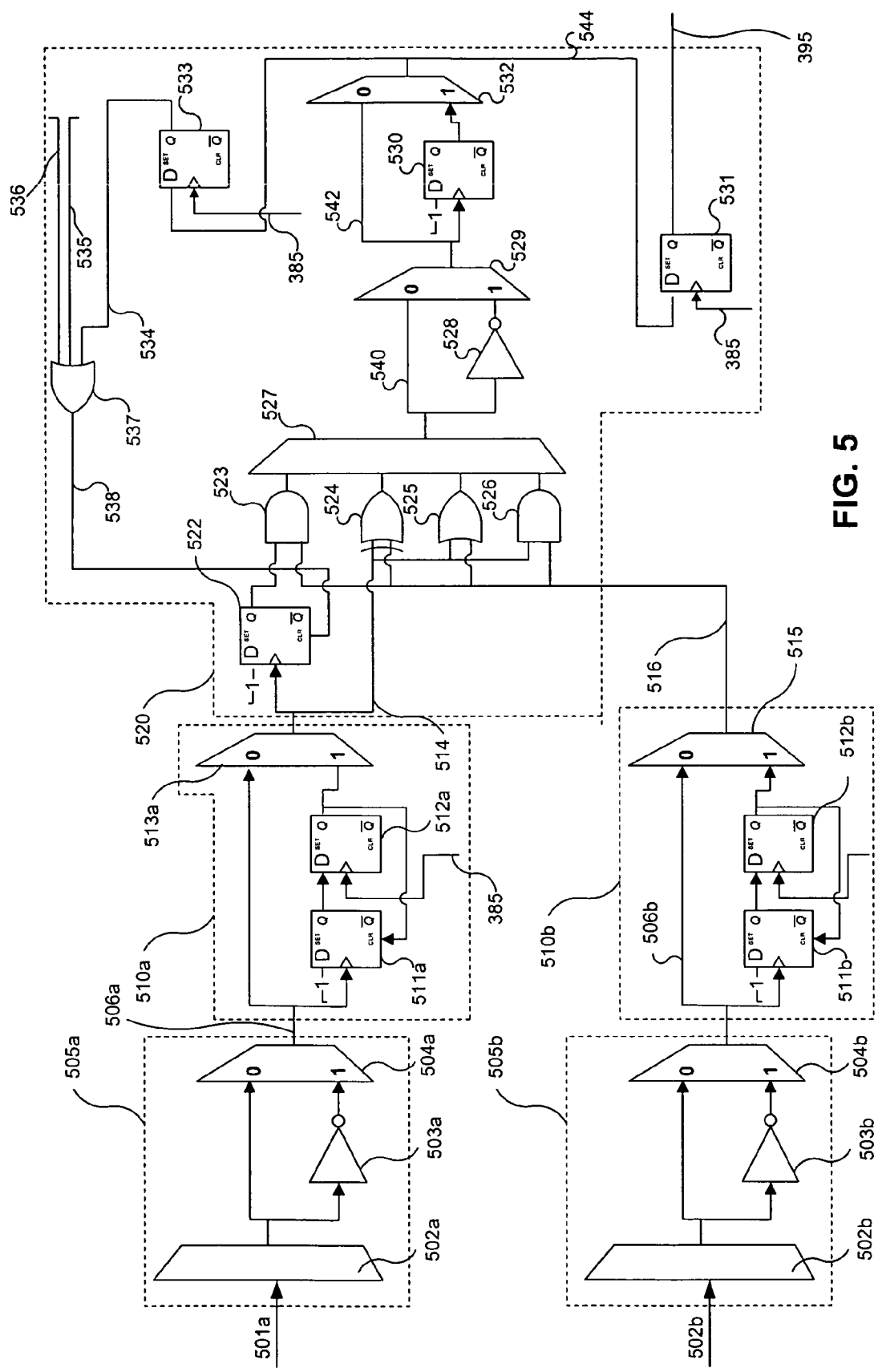
FIG. 5 illustrates an implementation example of a trigger control circuit.

FIG. 5 depicts an exemplary trigger control logic 228 according to an embodiment of the present invention. The trigger control logic 228 is configured to allow selection of trigger events from various internal nodes of the integrated circuit and to allow for logical and sequential combinations of multiple trigger sources to initiate and control the sampling of the internal states of the device tested. The trigger source selector provides signal inputs 501a and 501b to the trigger control logic from the internal test bus and/or nodes of the integrated circuit.

In an embodiment, signals 501a and 501b come from the internal test bus and/or nodes of a microprocessor. Trigger control logic 228 includes trigger source selector circuits 505a and 505b, edge detection circuits 510a and 510b and a logic control circuit 520.

A description of items 502a-513a will now be provided, it should be understood that items 502b-513b will have the same functionalities as items 502a-512a, respectively. Trigger source selector circuit 505a includes a signal multiplexer 502a, an inverter 503a, and a signal inversion selector 504a. Signal multiplexer 502a selects a signal source based on the user's input in block 215. The inverter 503a and the signal inversion selector 504a are set to receive the output signal of the signal multiplexer 502a. The signal inversion selector 504a is also configured to receive an inverted output signal of the inverter 503a. Depending upon the user's input in block 200, the signal inversion selector 504a will then select the inverted signal from the output of the inverter 503a or the selected signal from the signal multiplexer 502a as the output signal 506a.

The edge detection circuit 510a includes a pair of D-type positive edge-triggered flip-flops 511a and 512a, and signal multiplexer 513a. Flip-flop 511a and signal multiplexer 513a are both set to receive signal 506a. When signal 506a is rising (going from low to high), flip-flop 511a passes the value of the D terminal as the output of the Q terminal, which is then provided as an input to the D terminal of flip-flop 512a.

In the flip-flop 512a, when the sampling-clock signal 385 is rising, the output of the Q terminal of flip-flop 511a directly passes to the Q terminal of flip-flop 512a, which loops back to the reset/clear terminal of flip-flop 511a. Basically, when the sampling-clock signal 385 is rising and the Q terminal of flip-flop 511a is high, the Q terminal of flip-flop 511a is reset to low. When this reset condition is met, the Q terminal of flip-flop 511a is reset to low regardless of whether signal 506a is rising or not. Additionally, the output of the Q terminal of flip-flop 512a is also configured as an input to the signal multiplexer 513a, which selects flip-flop 512 Q terminal's output signal or the signal 506a as an output signal 514.

In an alternative embodiment, edge detection circuits 510a and 510b include negative edge-triggered flip-flop circuits. In yet another embodiment, each of the edge detection circuits 510a and 510b can take either form, positive or negative edge-triggered flip-flop circuit. Although, the present invention is described using edge detection logic circuit, other forms of logic triggering circuits can be used such as level-triggered or pulse triggered circuits.

At a high level, logic control circuit 520 receives input signals 514 and 516 from edge detection circuits 510a and 510b, respectively, and generates a trigger signal 395 which goes to the logic analyzer state machine 330.

The logic control circuit 520 includes four D type flip-flops 522, 530, 531, and 532, a pair of AND gates 523 and 526, an XOR gate 524, a pair of OR gates 525 and 537, an inverter 528, a trigger gate selector 527, and a pair of signal selectors 529 and 532. Flip-flop 522 is set to receive signal 514 and clear condition signal 538 from OR gate 537. If any one of the signals 534, 535, and 536 is high, the Q terminal of flip-flop 522 is reset to low. This occurs regardless of the state of the signal 514. Signal 536 determines if the logic analyzer is in acquisition mode. Signal 535 determines if the logic analyzer is enabled, and signal 534 comes from the output of the flip-flop 533's Q terminal, which will be further described below.

In the logic control circuit 520, the AND gate 523 is configured to receive the output of the flip-flop 522's Q terminal and the signal 516. The XOR gate 524, OR gate 525, and AND gate 526 are all configured to receive signals 514 and 516. The trigger gate selector 527 allows any of the outputs from the logic gates 523-526 to be selected as the input signal 540 to the inverter 528 and signal selector 529. The inverter 528 inverts signal 540 and passes to the signal selector 529, which selects either an inverted or non-inverted version of signal 540 as the output signal 542.

The output signal 542 is configured as an input to the clock terminal of flip-flop 530. At each rising edge of signal 542, flip-flop 530 passes a high signal to signal selector 532, which may select signal 542 or the Q terminal value of flip-flop 530 as the output signal 544. The output signal 544 is then passes to D terminal of flip-flops 531 and 533. At the rising edge of the sampling-clock signal 385, flip-flop 533 passes the output signal 544 as the output 534, which resets flip-flop 522 at high value. Similarly, at the rising edge of the sampling clock signal 385, flip-flop 531 passes signal 544 as the output signal 395, which provides an input to the logic analyzer state machine 330.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is claimed that:

1. A method for sampling internal data signals of an integrated circuit having a communication port, a plurality of buses, and an embedded logic analyzer coupled to both the communication port and the plurality of buses, comprising:
    (1) programming the embedded logic analyzer through the communication port, wherein the programming comprises selecting one of the integrated circuit's internal clocks for use as a sampling-clock;
    (2) sampling data signals from one of the plurality of buses using the embedded logic analyzer, wherein the sampling comprises decimating the sample clock by an integer n; and
    (3) storing the sampled data signals.

2. The method of claim 1, wherein step (1) comprises:
    selecting one of the plurality of buses for data sampling; and
    setting trigger conditions for the embedded logic analyzer to control the step of data sampling on the selected bus.

3. The method of claim 2, wherein step (2) comprises:
    collecting data signals from the selected bus in response to the sampling-clock; and
    identifying the trigger conditions on the selected bus.

4. The method of claim 3, wherein step (2) comprises:
    synchronizing the collected data with the identified trigger conditions.

5. The method of claim 1, wherein step (3) comprises:
    storing the, collected data signals along with corresponding trigger events data into a memory.

6. The method of claim 5, wherein the memory is in the integrated circuit.

7. The method of claim 5, wherein the memory is a RAM.

8. The method of claim 5, wherein the memory is shared with the integrated circuit.

9. The method of claim 1, wherein the communication port is a joint test action group port.

10. The method of claim 1, wherein the integrated circuit is a transceiver circuit.

11. The method of claim 1, wherein step (1) comprises:
    setting trigger conditions for the embedded logic analyzer to control the data sampling process.

12. An integrated circuit, comprising:
    a communication port;
    a plurality of buses; and
    a programmable logic analyzer circuit coupled to both the communication port and the plurality of buses, wherein
        the programmable logic analyzer circuit is programmed through the communication ports,
        the programmable logic analyzer circuit samples data signals from a selected one of the plurality of buses,
        the programmable logic analyzer circuit includes a clock selector that selects an internal clock of the integrated circuit for use as a sampling-clock, and
        the programmable logic analyzer circuit includes a clock decimator for decimating the sampling-clock by an integer n.

13. The integrated circuit of claim 12, wherein the programmable logic analyzer circuit comprises:
    a clock delay for delaying the sampling-clock;
    a signal selector that selects a first plurality of buses for data capturing;
    a data capture register that stores data signals from the first plurality of buses in response to the sampling-clock;
    a trigger source selector that selects a second plurality of buses for data monitoring;
    trigger control logic that detects trigger conditions by monitoring data signals from the second plurality of buses; and
    a control state machine, wherein the control state machine causes signal data from the data capture register and state data from the control state machine to be stored into a memory in response to the trigger control logic.

14. The integrated circuit of claim 13, wherein the programmable logic analyzer circuit further comprises:
    a synchronizer for synchronizing data from the data capture register with the detected trigger conditions.

15. The integrated circuit of claim 13, wherein the memory is shared with the microprocessor.

16. The integrated circuit of claim 13, wherein the memory is a dedicated memory that is used exclusively by the programmable logic analyzer circuit.

17. The integrated circuit of claim 13, wherein the first and second plurality of buses are different.

18. The integrated circuit of claim 12, wherein the communication port is a joint test action group port.

19. The integrated circuit of claim 12, wherein the microprocessor is coupled to a transceiver circuit.

20. An integrated circuit, comprising:
   a communication port;
   a plurality of buses; and
   a programmable logic analyzer coupled to both the communication port and the plurality of buses, the programmable logic analyzer can be programmed through the communication port to sample data signals from a selected plurality of buses, the programmable logic analyzer comprising:
      a clock generator;
      a clock selector that selects either an internal clock of the integrated circuit or the clock generator for use as a sampling-clock;
      a clock delay for delaying the sampling-clock;
      a clock decimator for decimating the sampling-clock by n, wherein n is an integer;
      a signal selector that selects a first plurality of buses for data capturing;
      a data capture register that stores data signals from the first plurality of buses in response to the sampling-clock;
      a trigger source selector that selects a second plurality of buses for data monitoring;
      trigger control logic that detects trigger conditions by monitoring data signals from the second plurality of buses; and
      a control state machine, wherein the state machine causes signal data from the data capture register and state data from the state machine to be stored into a memory in response to the trigger control logic.

21. The integrated circuit of claim 20, wherein the first and second plurality of buses are different.

* * * * *

UNITED STATES PATENT AND TRADEMARK OFFICE
CERTIFICATE OF CORRECTION

PATENT NO. : 7,350,121 B2 Page 1 of 1
APPLICATION NO. : 11/203288
DATED : March 25, 2008
INVENTOR(S) : John Lock Creigh It is certified that error appears in the above-identified patent and that said Letters Patent is hereby corrected as shown below:

Column 8, line 14, "storing the, collected" should read --storing the collected--.
Column 8, line 35, "communication ports," should read --communication port,--.

Signed and Sealed this

First Day of July, 2008

JON W. DUDAS
*Director of the United States Patent and Trademark Office*